(12) United States Patent
Sato et al.

(10) Patent No.: US 9,521,762 B2
(45) Date of Patent: Dec. 13, 2016

(54) ATTACHMENT STRUCTURE

(75) Inventors: Koki Sato, Makinohara (JP);
Fumiyoshi Ohashi, Makinohara (JP);
Yukinari Naganishi, Kosai (JP); Yuuji Fukuyama, Susono (JP); Akihiro Fuseya, Toyota (JP)

(73) Assignee: Yazaki Corporation, Tokyo (JP)

( * ) Notice: Subject to any disclaimer, the term of this patent is extended or adjusted under 35 U.S.C. 154(b) by 227 days.

(21) Appl. No.: 13/371,650

(22) Filed: Feb. 13, 2012

(65) Prior Publication Data

US 2012/0205507 A1 Aug. 16, 2012

(30) Foreign Application Priority Data

Feb. 14, 2011 (JP) ................................ 2011-028684

(51) Int. Cl.

| A47B 96/06 | (2006.01) |
|---|---|
| A47G 29/00 | (2006.01) |
| A47K 1/00 | (2006.01) |
| E04G 3/00 | (2006.01) |
| E04G 5/06 | (2006.01) |
| F21V 21/00 | (2006.01) |
| F21V 35/00 | (2006.01) |
| H05K 5/00 | (2006.01) |
| B60R 16/02 | (2006.01) |
| A47B 96/00 | (2006.01) |
| F16L 3/08 | (2006.01) |
| H01J 5/00 | (2006.01) |
| H01J 15/00 | (2006.01) |

(Continued)

(52) U.S. Cl.
CPC ......... *H05K 5/0073* (2013.01); *B60R 16/0215* (2013.01); *F16B 5/0225* (2013.01); *F16B 5/0241* (2013.01); *F16B 21/09* (2013.01); *F16B 37/047* (2013.01)

(58) Field of Classification Search
CPC ....... F16B 5/0225; F16B 37/047; F16B 21/09; F16B 5/0241; B60R 16/0215
USPC ....... 174/50, 520, 17 R, 559, 54, 58, 61, 63; 248/222.13, 220.21, 220.22, 225.11, 248/224.8, 223.41; 411/136, 104; 403/408.1
See application file for complete search history.

(56) References Cited

U.S. PATENT DOCUMENTS

| 5,888,012 A | * | 3/1999 | Nygren, Jr. ........... F16B 5/0225 403/13 |
|---|---|---|---|
| 2008/0003079 A1 | * | 1/2008 | Martinson ..................... 411/539 |
| 2009/0017648 A1 | * | 1/2009 | Sano .................... H05K 5/0073 439/76.2 |

FOREIGN PATENT DOCUMENTS

| CN | 101373887 A | 2/2009 |
|---|---|---|
| JP | 4-127405 U | 4/1992 |

(Continued)

OTHER PUBLICATIONS

Chinese Office Action dated May 6, 2014 issued for corresponding Chinese Patent Application No. 201210063877.6.

*Primary Examiner* — Brian Mattei
*Assistant Examiner* — Taylor Morris
(74) *Attorney, Agent, or Firm* — Locke Lord LLP (57) ABSTRACT

An attachment structure 1 includes: a plurality of attaching legs 5, 6, 7 projected from an outer surface of a box main body 2 as the object and overlapped with a vehicle attaching portion 3 as the subject; a washer 8 fixed to the vehicle attaching portion 3 together with one attaching leg 7 by a bolt, while being overlapped with the one attaching leg 7 at a side away from the vehicle attaching portion 3; and a cover 9 attached to the one attaching leg 7, holding the washer 8 between the cover 9 and the one attaching leg 7. The cover (Continued)

9 is provided with an exposing hole 9*a* for exposing a first hole portion 8*a* provided on the washer 8.

3 Claims, 6 Drawing Sheets (51) Int. Cl.
*H02G 3/08* (2006.01)
*H02B 1/30* (2006.01)
*H02G 13/00* (2006.01)
*H01R 13/46* (2006.01)
*H01R 13/502* (2006.01)
*F16B 5/02* (2006.01)
*F16B 37/04* (2006.01)
*F16B 21/09* (2006.01)

(56) References Cited

FOREIGN PATENT DOCUMENTS

| JP | 04127405 U | * 11/1992 | ................ F16B 5/02 |
| JP | 11-032411 A | 2/1999 | |

* cited by examiner

ATTACHMENT STRUCTURE

CROSS REFERENCE TO RELATED APPLICATIONS

This application is on the basis of Japanese Patent Application No. 2011-028684, the contents of which are hereby incorporated by reference.

BACKGROUND OF THE INVENTION

Field of the Invention

The present invention relates to an attachment structure for attaching an object to a subject.

Description of the Related Art

Various electronic devices are mounted on a vehicle. For distributing electric power to these electronic devices, an electric junction box intensively composed of electric components such as a connector, a relay, and a fuse is disposed in the vehicle at a proper position between a power source and the electronic devices.

Figure 11:
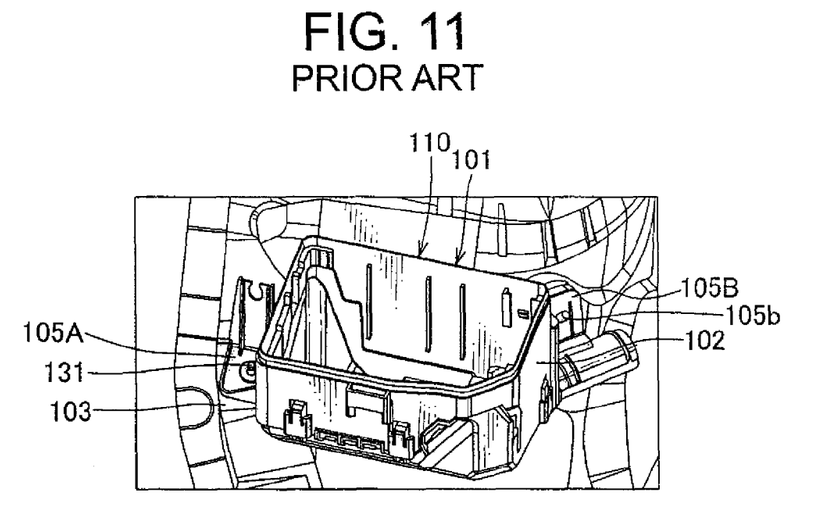
FIG. 11 is a perspective view showing a conventional electric junction box attached to a vehicle body.
Figure 12:
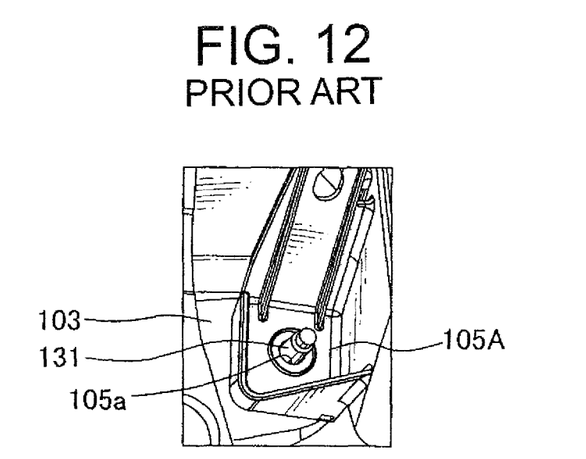
FIG. 12 is an exploded perspective view showing one attaching leg as a component of the electric junction box shown in FIG. 11.
Figure 13:
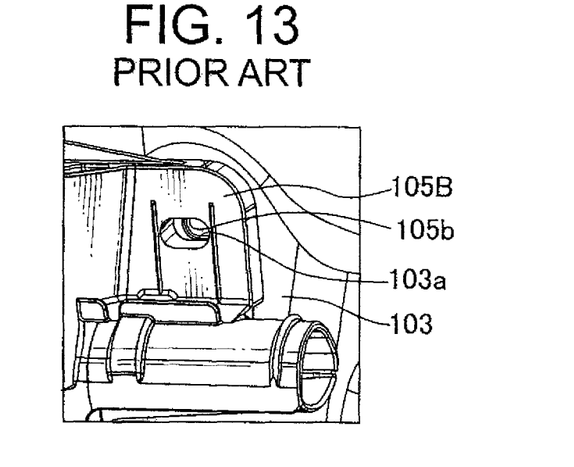
FIG. 13 is an exploded perspective view showing the other attaching leg as a component of the electric junction box shown in FIG. 11.

The electric junction box is provided with a plurality of attaching legs for attaching a box main body as an object receiving the electric components to a vehicle body as a subject. FIG. 11 is a perspective view showing a conventional electric junction box attached to a vehicle body. FIG. 12 is an exploded perspective view showing one attaching leg as a component of the electric junction box shown in FIG. 11. FIG. 13 is an exploded perspective view showing the other attaching leg as a component of the electric junction box shown in FIG. 11.

A conventional electric junction box 110 shown in FIG. 11 includes: a box main body 102 receiving electric components such as a connector, a relay, and a fuse; two attaching legs 105A, 105B projected from an outer surface of the box main body 102 for fixing the box main body 102 to a vehicle body 103 with a bolt; and a cover (not shown) for covering an opening of the box main body 102. The box main body 102 and the two attaching legs 105A, 105B are integrally made of synthetic resin. In FIG. 11, the cover is detached from the box main body 102. (For example, see Patent Document 1).

The two legs 105A, 105B are respectively provided with hole portions 105a, 105b for inserting a stud bolt 131 projected from a surface of the vehicle body 103 or a bolt (not shown).

The vehicle body 103 is provided with the stud bolt 131 and a bolt attaching hole 103a. A relative position between the stud bolt 131 and the bolt attaching hole 103a both mounted on the vehicle body 103 is easy to produce a gap. Therefore, when the electric junction box 110 is attached to the vehicle body 103, a gap is easy to be produced between the relative position between the two attaching legs 105A, 105B and the relative position between the stud bolt 131 and the bolt attaching hole 103a of the vehicle body 103. Therefore, by enlarging diameters of the hole portions 105a, 105b provided on the attaching legs 105A, 105B, and by moving the electric junction box 110 relative to the vehicle body 103, a position gap between the electric junction box 110 and the vehicle body 103 is absorbed.

As shown in FIG. 12, the hole portion 105a of one attaching leg 105a of the two attaching legs 105A, 105B is formed in a circular shape. Further, as shown in FIG. 13, the other hole portion 105b is formed in an oval shape.

The electric junction box 110 is attached to the vehicle body 103 in the following procedure. The electric junction box 110 is moved close to the vehicle body 103, and the stud bolt 131 is inserted into the hole portion 105a of the one attaching leg 105A. Next, the other attaching leg 105B is overlapped with the vehicle body 103 so that the hole portion 105b of the other attaching leg 105B is overlapped with the bolt attaching hole 103a. Then, a blot is screwed into the hole portion 105b and the bolt attaching hole 103a. Next, a nut (not shown) is screwed with the stud bolt 131 inserted into the hole portion 105a. Thus, the electric junction box 110 is attached to the vehicle body 103.

[Patent Document 1] JP, A, H11-32411

Recently, with an increase of the number of the electronic devices mounted on a vehicle, the number of components attached to a vehicle has been increased. With an increase of the number of the components attached to a vehicle, the box main body 102 receiving the electric components becomes larger, and the number of the attaching legs 105A, 105B is increased for attaching the larger box main body 102 to the vehicle body 103.

Therefore, the number of the stud bolts 131 and the bolt attaching holes 103a provided on the vehicle body 103 for attaching the attaching legs 105A, 105B to the vehicle body 103 is increased. Therefore, the position gaps between the attaching legs 105A, 105B and the stud bolts 131 and the bolt attaching holes 103a provided on the vehicle body 103 become larger. Therefore, for absorbing the larger position gap, it is necessary to further enlarge the hole portions 105a, 105b. It is necessary to produce discretely a nonstandard nut of which outer diameter is larger than the hole portions 105a, 105b, or a nonstandard bolt of which head diameter is larger than the hole portions 105a, 105b, and there is a problem that a cost is increased. Further, there is also a problem that when the hole portions 105a, 105b are enlarged, the bolt becomes easy to be buckled. Further, because the force applied to the attaching legs 105A, 105B by the nut or the bolt is only applied to edges of the hole portions 105a, 105b of the attaching legs 105A, 105B when the nut or the bolt is screwed, there is a problem that the attaching legs 105A, 105B may be buckled.

Accordingly, an object of the present invention is to solve these problems. Namely, the object of the present invention is to provide an attachment structure to prevent a cost from increasing by absorbing a position gap between a plurality of attaching legs projected from an object and a subject to be attached.

SUMMERY OF THE INVENTION

According to the present invention, there is provided an attachment structure for attaching an object to a subject including: a plurality of attaching legs projected from an outer surface of the object and overlapped with the subject; a washer fixed to the subject together with one attaching leg by a bolt, while being overlapped with at least one of the attaching legs at a side away from the subject; and a cover attached to the one attaching leg, holding the washer between the cover and the one attaching leg, and having an exposing hole for exposing a first hole provided on the washer, wherein a diameter of the first hole is smaller than a diameter of a second hole provided on the one attaching leg for inserting a shaft of the bolt, and wherein the washer is held between the one attaching leg and the cover movably in at least a range where the first hole is overlapped with the second hole provided on the one attaching leg.

Preferably, a surface of the one attaching leg with which the washer is overlapped is provided with a concave which is larger than the washer, and the washer is movably received in the concave.

Preferably, a size from an edge of the first hole to an outer edge of the washer is equal to a size from an edge of the second hole to an outer edge of the concave.

Preferably, the cover includes: a substrate for holding the washer between the substrate and the one attaching leg; a peripheral plate projected from an edge of the substrate and overlapped with a side wall of the one attaching leg; and a locking portion provided on the peripheral plate to be locked with the one attaching leg, and when the cover is slid with respect to the one attaching leg, the locking portion is locked with the one attaching leg.

Preferably, a projection is projected from an outer surface of the substrate.

These and other objects, features, and advantages of the present invention will become more apparent upon reading of the following detailed description along with the accompanied drawings.

DETAILED DESCRIPTION OF THE PREFERRED EMBODIMENTS

Hereinafter, an attachment structure 1 according to an embodiment of the present invention will be explained with reference to FIGS. 1 to 10. Further, the attachment structure 1 of this embodiment as shown in such as FIG. 1 is a component of an electric junction box 10.

The electric junction box 10 is mounted on an engine room of a vehicle, and distributes electric power to various electronic components and electric components mounted on the vehicle. Further, in this embodiment, a junction block, a fuse block, and a relay box are collectively referred to as the electric junction box.

Figure 1:
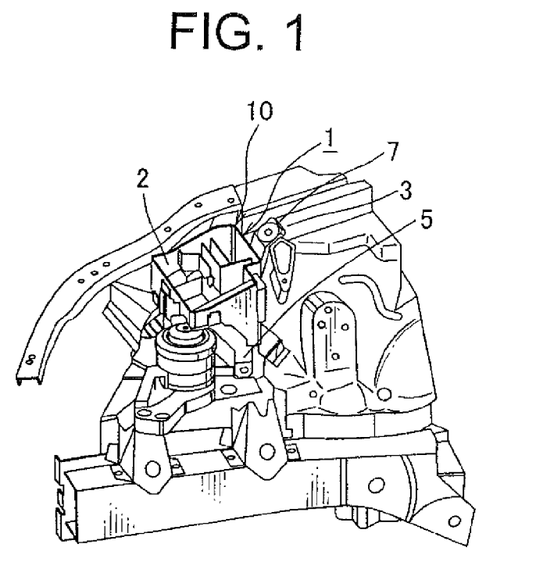
FIG. 1 is a perspective view showing an electric junction box having an attachment structure according to an embodiment of the present invention.
Figure 2:
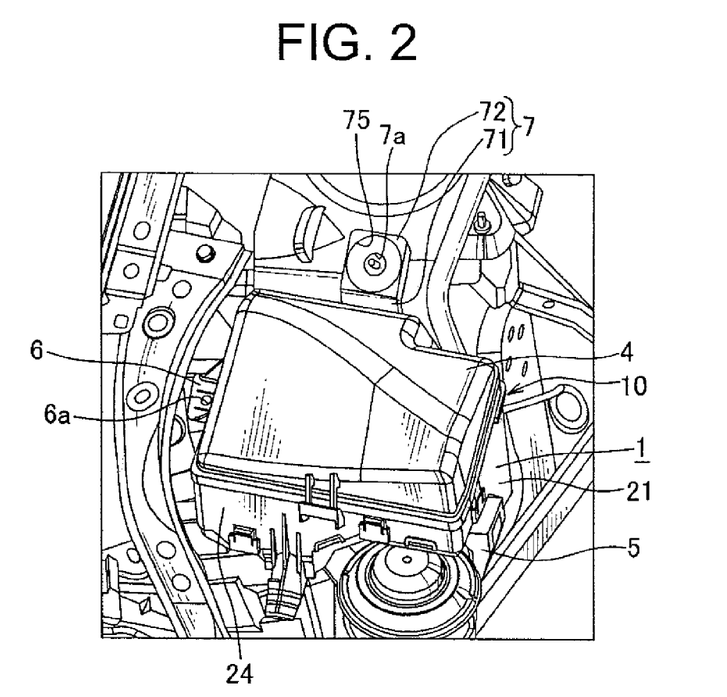
FIG. 2 is an enlarged view showing the attachment structure shown in FIG. 1 from a different angle.

As shown in FIGS. 1 and 2, the electric junction box 10 includes: a box main body 2 for receiving electric components such as a connector, a relay, and a fuse; a cover 4 (shown in FIG. 2) for covering an opening of the box main body 2; and the attaching structure 1.

The attachment structure 1 includes: a plurality of attaching legs 5, 6, 7 projected from an outer surface of a box main body 2 and overlapped with a vehicle attaching portion 3; a washer 8 overlapped with the one attaching leg 7 of the attaching legs 5, 6, 7 at a side away from the vehicle attaching portion 3; and a cover 9 for holding the washer 8 between the cover 9 and the one attaching leg 7. The attachment structure 1 is fixed to the vehicle attaching portion 3 together with the one attaching leg 7 by a bolt, while the washer 8 is overlapped with the one attaching leg 7 at a side away from the vehicle attaching portion 3. Further, the box main body 2 corresponds to the object in claims, and the vehicle attaching portion 3 corresponds to the subject in claims.

The box main body 2 includes: a bottom wall (not shown) opposite to the cover 4; and four side walls 21, 22, 23, 24 extended vertically from edges of the bottom wall.

In this embodiment, three attaching legs 5, 6, 7 are provided. In this description, for making an explanation plain, one of the three attaching legs is referred to as a first attaching leg 5, another one is referred to as a second attaching leg 6, and the other one is referred to as a third attaching leg 7. Further, the first attaching leg 5 is provided on a sidewall 21 of the box main body 2. The second attaching leg 6 is provided on a sidewall 22 facing the sidewall 21 of the box main body 2. The third attaching leg 7 is provided on a sidewall 23 perpendicular to both sidewalls 21, 22. Further, the first attaching leg 5 and the second attaching leg 6 are formed integrally with the box main body 2, and the third attaching leg 7 is formed independently from the box main body 2.

Hereinafter, a case that the vehicle attaching portion 3 corresponding to the first attaching leg 5 is provided with a bolt attaching hole 3a, and the vehicle attaching portions 3 corresponding to the second attaching leg 6 and the third attaching leg 7 are provided with stud bolts 31 will be explained as an example. However, it is optional whether the vehicle attaching portion 3 is provided with the bolt attaching hole 3a or the stud bolt 31. In essence, when the bolt attaching hole 3a is provided on the vehicle attaching portion 3, a bolt may be screwed, and when the stud bolt 31 is provided on the vehicle attaching portion 3, a nut may be screwed.

Figure 3:
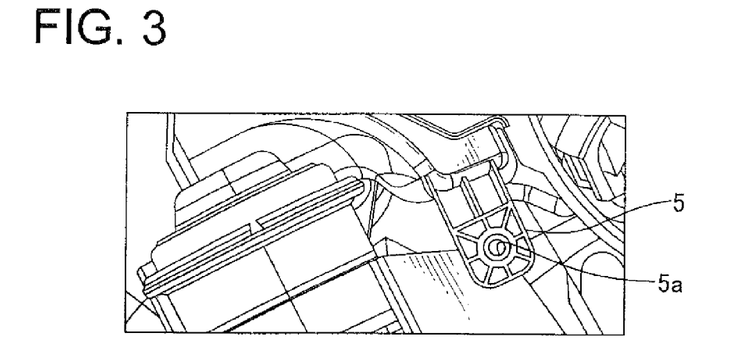
FIG. 3 is a perspective view showing a first attaching leg as a component of the attachment structure shown in FIG. 2 overlapped with a vehicle body.

As shown in FIGS. 1 and 3, the first attaching leg 5 is formed in a plate shape, and provided with a hole portion 5a as a through-hole at the center of the first attaching leg 5. This hole portion 5a of the first attaching leg 5 is formed in a regular circle having a diameter of 7 mm. Further, not shown washer and bolt are screwed with the hole portion 5a. An outer diameter of the washer is 13.6 mm. In this embodiment, the washer and the bolt are separated from each other. However, the washer and the bolt may be integrally formed with each other.

Figure 4:
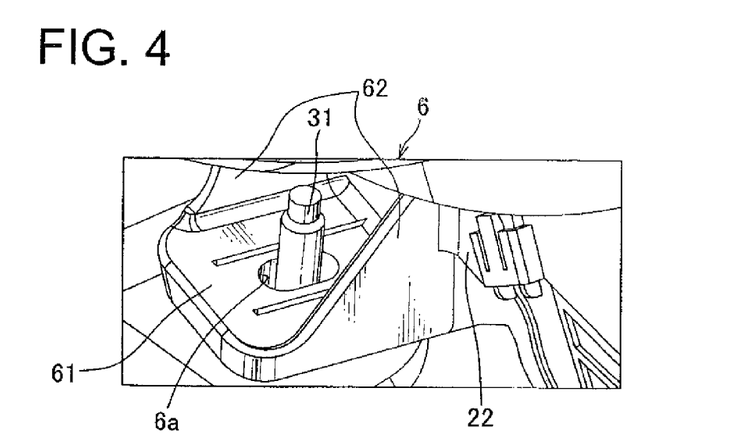
FIG. 4 is a perspective view showing a second attaching leg as a component of the attachment structure shown in FIG. 2 overlapped with a vehicle body.

The second attaching leg 6 includes: a plate-shaped overlapping plate 61; an oval hole portion 6a provided in the center of the overlapping plate 61 as a through-hole; and a pair of reinforcing portions 62 projected from the sidewall 22 and continued to an outer edge of the overlapping plate 61. The pair of reinforcing portions 62 is provided so as to position the oval hole portion 6a between the reinforcing portions 62.

The oval hole portion 6a of the second attaching leg 6 is 13 mm in a longitudinal direction, and 7 mm in a width direction. Further, the stud bolt 31 projected from the vehicle attaching portion 3 is inserted into the oval hole portion 6a. Further, not-shown washer and nut are screwed with the stud bolt 31 inserted into the oval hole portion 6a. An outer diameter of this washer is 13.6 mm. Further, this nut is a standard product such as JIS standard. Incidentally, in this embodiment, the washer and the bolt are separated from each other. However, the washer and the bolt may be integrally formed with each other.

Figure 5:
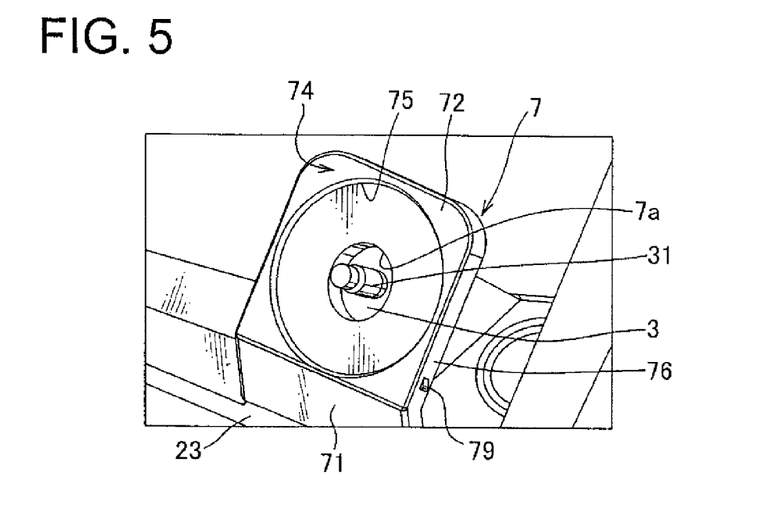
FIG. 5 is a perspective view showing a third attaching leg as a component of the attachment structure shown in FIG. 2 overlapped with a vehicle body.

As shown in FIGS. 1 and 5, the third attaching leg 7 includes: a base portion 71 projected from an outer surface of the sidewall 23; and an overlapping portion 72 continued to the base portion 71 and overlapped with the vehicle attaching portion 3. Further, the third attaching leg 7 corresponds to at least one leg of the attaching legs in claims.

Figure 6:
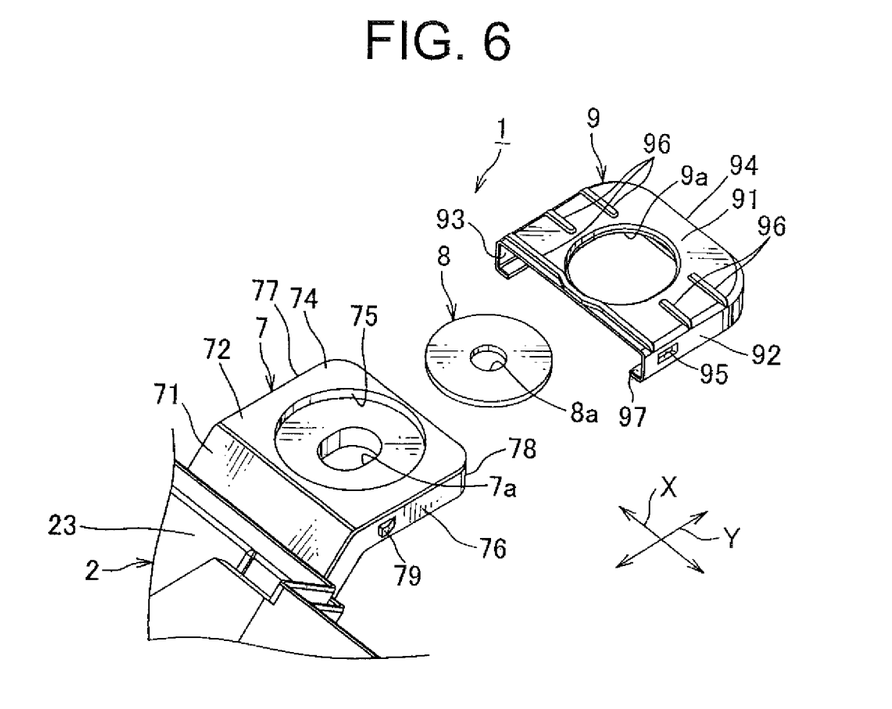
FIG. 6 is a perspective view showing a washer and a cover about to be attached to the third attaching leg shown in FIG. 5.
Figure 7:
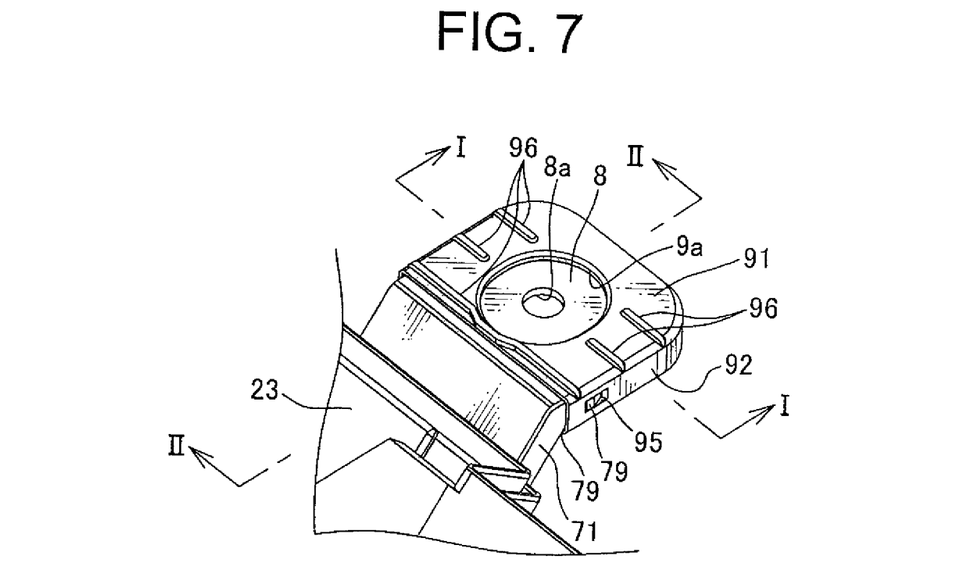
FIG. 7 is a perspective view showing the washer and the cover attached to the third attaching leg shown in FIG. 6.

As shown in FIGS. 6 and 7, the overlapping portion 72 includes: a bottom wall (not shown) overlapped with the vehicle attaching portion 3; a ceiling wall 74 facing the bottom wall; and sidewalls 76, 77, 78 positioned between the bottom wall and the ceiling wall 74. Further, the overlapping portion 72 is provided with a concave 75 with which the washer 8 is overlapped, a second hole portion 7a as a though-hole formed on the concave 75, and a pair of locking projections 79 for attaching the cover 9.

The concave 75 is formed in a concave shape from a surface of the ceiling wall 74. Further, a diameter of the concave 75 is larger than an outer diameter of the washer 8 so that the washer 8 is movably received in the concave 75.

Figure 8A:
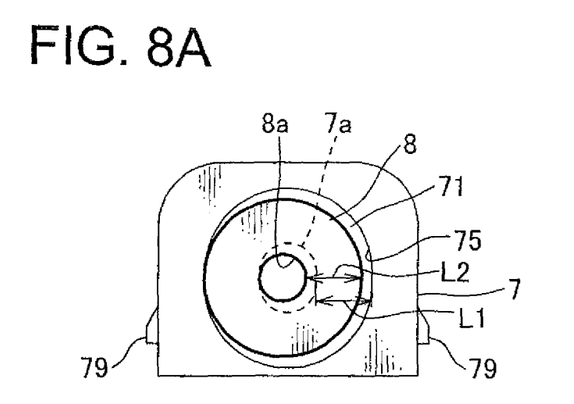
FIG. 8A is a top view showing the washer received in a concave of the third attaching leg shown in FIG. 5, and positioned at a left end of the concave in a paper direction.
Figure 8B:
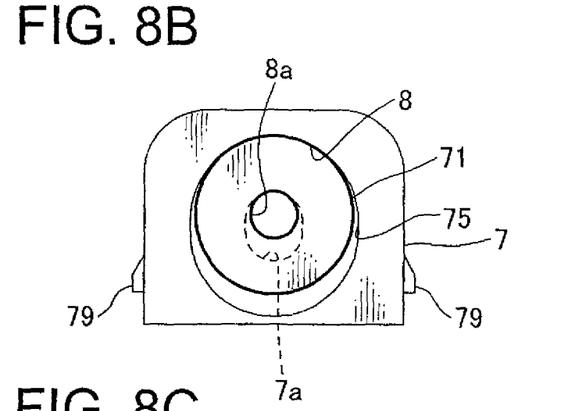
FIG. 8B is a top view showing the washer received in a concave of the third attaching leg shown in FIG. 5, and positioned at a top end of the concave in the paper direction.
Figure 8C:
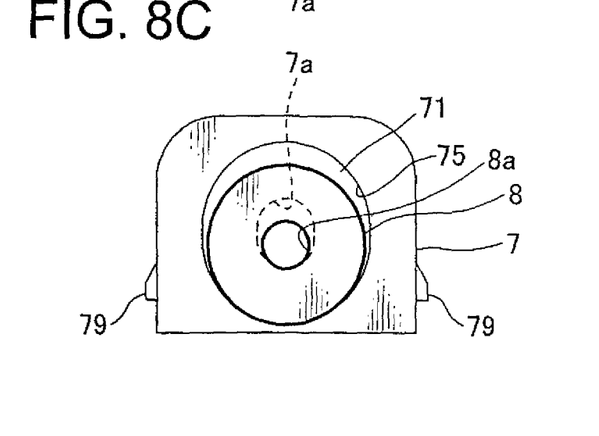
FIG. 8C is a top view showing the washer received in a concave of the third attaching leg shown in FIG. 5, and positioned at a bottom end of the concave in the paper direction.

As shown in FIG. 8, this concave 75 is formed in an oval shape in plan view so that a size L1 from an edge of the second hole portion 7a to an outer edge of the concave 75 is equal to a size L2 from an edge of a later-described first hole portion 8a of the washer 8 (an inner edge of the washer 8) to an outer edge of the washer 8.

FIGS. 8A to 8C are a top view showing the washer 8 received in the concave 75 of the third attaching leg 7. Incidentally, in FIGS. 8A to 8C, the washer 8 is shown by a heavy line, the third attaching leg 7 is shown by a thin line, and the second hole portion 7a is shown by a dashed line. As shown in FIG. 8A, even when the washer 8 is positioned at a left end of the concave 75 in a paper direction, the whole first hole portion 8a is overlapped with the second hole portion 7a. As shown in FIG. 8B, even when the washer 8 is positioned at a top end of the concave 75 in the paper direction, the whole first hole portion 8a is overlapped with the second hole portion 7a. As shown in FIG. 8C, even when the washer 8 is positioned at a bottom end of the concave 75 in the paper direction, the whole first hole portion 8a is overlapped with the second hole portion 7a. Accordingly, even when the washer 8 is moved to any position in the concave 75, the first hole portion 8a of the washer 8 is overlapped with the second hole portion 7a.

A maximum diameter of the second hole portion 7a passing the center of the second hole portion 7a is 16.2 mm, and a minimum diameter of the second hole portion 7a is 13.5 mm. Further, the stud bolt 31 projected from the vehicle attaching portion 3 is inserted into the second hole portion 7a. After the stud bolt 31 is inserted into the second hole portion 7a, the nut is screwed with the stud bolt 31.

As shown in FIG. 6, the pair of locking projections 79 as lock receiving portions is respectively projected from a pair of sidewalls 76, 77 facing each other. Further, the pair of locking projections 79 is provided on end portions of the sidewalls 76, 77 at the base portion 71 side.

The washer 8 is made of metal. Further, as shown in FIG. 6, the washer 8 is formed in a ring shape, and provided with the first hole portion 8a as a through-hole in the center of the washer 8. A diameter of this first hole portion 8a (an inner diameter of the washer 8) is smaller than an outer diameter of the nut. Further, an outer diameter of the washer 8 is larger than the maximum diameter of the second hole portion 7a of the third attaching leg 7.

As shown in FIG. 7, the cover 9 includes: a plate-shaped substrate 91 for holding the washer 8 between the third attaching leg 7 and the substrate 91; a plurality of ribs 96 as projections provided on the substrate 91; peripheral plates 92, 93, 94 extended vertically from an edge of the substrate 91, and overlapped with the sidewalls 76, 77, 78 of the third attaching leg 7; a pair of locking holes 95 for locking with the pair of locking projections 79 of the third attaching leg 7; and a parallel plate 97 continued to edges of the peripheral plates 92, 93, 94 and holding the third attaching leg 7 (overlapping portion 72) between the substrate 91 and the parallel plate 97. The pair of locking holes 95 respectively penetrates the peripheral plates 92, 93. Further, when the cover 9 is slid in an arrow Y direction, namely, slid along the ceiling wall 74 of the overlapping portion 72, the locking projections 79 are locked with the locking holes 95, and the cover 9 is attached to the third attaching leg 7.

The substrate 91 is provided with an exposing hole 9a for exposing the first hole portion 8a provided on the washer 8 received in the concave 75. This exposing hole 9a is larger than the second hole portion 7a of the third attaching leg 7, and smaller than the outer diameter of the washer 8.

As shown in FIG. 6, the ribs 96 are projected from an outer surface of the substrate 91 opposite to the third attaching leg 7. The ribs 96 are arranged with gaps in a sliding direction (arrow Y direction). The ribs 96 are extended in a direction (arrow X direction) perpendicular to the sliding direction (arrow Y direction).

Figure 9:
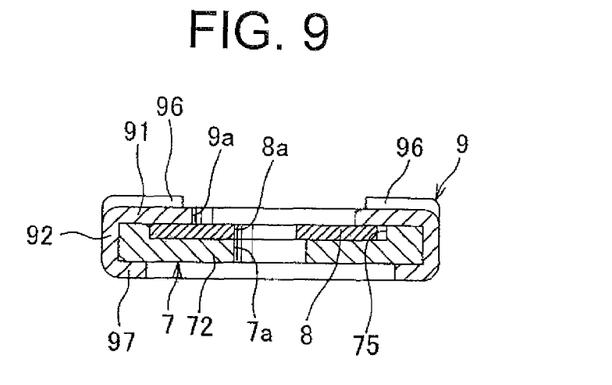
FIG. 9 is a sectional view taken on line I-I of FIG. 7.
Figure 10:
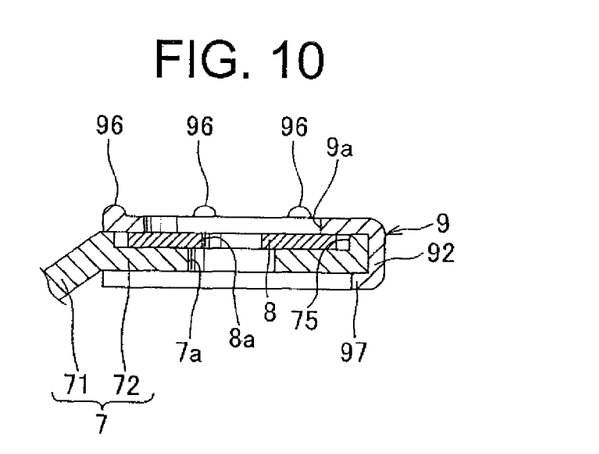
FIG. 10 is a sectional view taken on line II-II of FIG. 7.

Next, an assembling procedure of the electric junction box 10 having the attachment structure 1 will be explained. Previously, electric components are received in an inside of the box main body 2, and the cover 4 is attached to the box main body 2 receiving the electric components. Then, after the washer 8 is received in the concave 75 of the third attaching leg 7, the cover 9 is slid in the arrow Y direction to be moved close to the box main body 2. Edges of the peripheral plates 92, 93 of the cover 9 abut on the locking projections 79. When the cover 9 is further slid, the peripheral plates 92, 93 are moved on the locking projections 79, and deformed in a direction away from the sidewalls 76, 77 (arrow X direction). When the cover 9 is further slid, the peripheral plates 92, 93 are moved over the locking projections 79, and the locking projections 79 are inserted into the locking holes 95, namely, the locking projections 79 are locked with the locking holes 95. At this time, the peripheral plates 92, 93 are restored to a condition before elastically deformed. Thus, the cover 9 is attached to the third attaching leg 7 (overlapping portion 72). At this time, as shown in FIGS. 9 and 10, the washer 8 is received in the concave 75 in a manner that the whole first hole portion 8a is overlapped with the second hole portion 7a and the exposing hole 9a.

Next, the third attaching leg 7 having the washer 8 and the cover 9 is attached to the sidewall 23 of the box main body 2. Alternatively, previously the third attaching leg 7 may be attached to the sidewall 23 of the box main body 2, and then the washer 8 and the cover 9 may be attached to the third attaching leg 7. Thus, the electric junction box 10 is assembled.

Next, an attaching procedure for attaching the attachment structure 1 (electric junction box 10) to the vehicle attaching portion 3 as the subject will be explained. Firstly, when the electric junction box 10 is moved close to the vehicle attaching portion 3, the stud bolt 31 projected from the vehicle attaching portion 3 is inserted into the oval hole portion 6a of the second attaching leg 6, and at the same time, the stud bolt 31 projected from the vehicle attaching portion 3 is inserted into the second hole portion 7a, the first hole portion 8a, and the exposing hole 9a overlapped with each other. Next, the whole electric junction box 10 is moved so that the hole portion 5a of the first attaching leg 5 is overlapped with the bolt attaching hole 3a provided on the vehicle attaching portion 3. Then, the washer and the bolt are screwed with the hole portion 5a and the bolt attaching hole 3a overlapped with each other.

Next, the washer and the bolt are screwed with the stud bolt 31 inserted into the oval hole portion 6a of the second attaching leg 6. Further, the washer and the bolt are screwed with the stud bolt 31 inserted into the second hole portion 7a of the third attaching leg 7, the first hole portion 8a of the washer 8, and the exposing hole 9a of the cover 9. Thus, the attachment structure 1 (electric junction box 10) is attached to the vehicle attaching portion 3 as the subject.

According to this embodiment, the attachment structure 1 includes: the plurality of attaching legs 5, 6, 7 projected from the outer surface of the box main body 2 and overlapped with the vehicle attaching portion 3; the washer 8 fixed to the vehicle attaching portion 3 together with one attaching leg 7 by a bolt, while being overlapped with the one attaching leg 7 at a side away from the vehicle attaching portion 3; and the cover 9 attached to the one attaching leg 7, holding the washer 8 between the cover 9 and the one attaching leg 7. The cover 9 is provided with the exposing hole 9a for exposing the first hole portion 8a provided on the washer 8. A diameter of the first hole portion 8a is smaller than a diameter of the second hole 7a provided on the one attaching leg 7. The washer 8 is held between the one attaching leg 7 and the cover 9 movably in a range where the first hole 8a is overlapped with the second hole 7a. Therefore, it is unnecessary to specially produce a nonstandard nut corresponding to the diameter of the second hole portion 7a (when the bolt attaching hole is formed on the vehicle attaching portion 3 corresponding to the third attaching leg 7, a nonstandard bolt). A standard nut corresponding to the first hole portion 8a (when the bolt attaching hole is formed on the vehicle attaching portion 3 corresponding to the third attaching leg 7, a standard bolt) can be used. Therefore, even when the number of the attaching legs 5, 6, 7 is increased by enlarging the box main body 2 in accordance with the increase of the number of the vehicle attaching component, the attachment structure 1 to prevent a cost from increasing by absorbing a position gap between the plurality of attaching legs 5, 6, 7 and the vehicle attaching portion 3 can be provided. Further, because the washer 8 is held between the third attaching leg 7 and the cover 9, even when the third attaching leg 7 is moved, the washer 8 is prevented from falling out or disappearing. Further, the third attaching leg 7 can be attached to the vehicle attaching portion 3 by inserting the stud bolt 31 projected from the outer surface of the vehicle attaching portion 3 into the first hole portion 8a, the second hole portion 7a, and the exposing hole 9a overlapped with each other similar to the conventional easy operation. Therefore, assembling workability can be improved. Further, when the nut (when the bolt attaching hole is formed on the vehicle attaching portion 3 corresponding to the third attaching leg 7, a bolt) is screwed, a force applied to the one attaching leg 7 by the nut (when the bolt attaching hole is formed on the vehicle attaching portion 3 corresponding to the third attaching leg 7, the bolt) is not concentrated to an edge of the first hole portion 8a of the third attaching leg 7, and dispersed by the washer 8. Therefore, the one attaching leg 7 is prevented from being buckled.

Further, a surface of the third attaching leg 7 where the washer 8 is overlapped is provided with the concave 75 larger than the washer 8, and the washer 8 is movably received in the concave 75. Therefore, when the cover 9 is attached to the third attaching leg 7, the washer 8 is prevented from falling out of the third attaching leg 7. Therefore, the assembling workability can be further improved with a simple structure.

Further, the size L2 from the edge of the first hole portion 8a to the outer edge of the washer 8 is designed to be equal to the size L1 from the edge of the second hole portion 7a to the outer edge of the concave 75. Therefore, after the washer 8 is received in the concave 75, the whole first hole portion 8a is constantly overlapped with the second hole portion 7a even when the washer 8 is moved to any position in the concave 75. Therefore, the assembling workability can be further improved.

Further, the cover 9 includes: the substrate 91 for holding the washer 8 between the one attaching leg 7 and the substrate 91; the peripheral plates 92, 93, 94 extended vertically from edges of the substrate 91 and overlapped with the sidewalls 76, 77, 78 of the one attaching leg 7; and locking holes 95 provided on the peripheral plates 92, 93, 94 and locked with the one attaching leg 7. Further, when the cover 9 is slid with respect to the one attaching leg 7, the locking holes 95 are locked with the one attaching leg 7. Therefore, by an easy operation of sliding the cover 9 with respect to the one attaching leg 7, the cover 9 is attached to the one attaching leg 7.

Further, the ribs 96 as the projections projected from the outer surface of the substrate 91 are provided. Therefore, when the cover 9 is slid with respect to the one attaching leg 7, the ribs 96 work as nonslip members. Therefore, the assembling workability can be further improved.

Incidentally, in the embodiment described above, the attachment structure 1 is used in the electric junction box 10. However, the attachment structure 1 of the present invention can be used in other than the electric junction box 10. Namely, the object in the present invention is not only the box main body 2 but also a device main body, a protector or the like.

Further, in the embodiment described above, the third attaching leg 7 as the one attaching leg is solely provided. However, the present invention is not limited to this. The number of the one attaching legs may be more than one.

Further, in the embodiment described above, the washer 8 is made of metal. However, the present invention is not limited to this. The washer 8 may be made of resin.

Further, in the embodiment described above, the concave 75 is provided on the third attaching leg 7. However, the present invention is not limited to this. The concave 75 may be provided on a surface of the substrate 91 of the cover 9 where the washer 8 is overlapped.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

REFERENCE SIGNS LIST 1 attachment structure
2 box main body (object)
3 vehicle attaching portion (subject)
5 first attaching leg (a plurality of attaching legs)
6 second attaching leg (a plurality of attaching legs)
7 third attaching leg (a plurality of attaching legs)
7a second hole portion
75 concave
76, 77 sidewalls
8 washer
8a first hole portion
9 cover
9a exposing hole
91 substrate
92, 93 peripheral plates
95 locking holes (locking portions)
96 ribs (projections)

What is claimed is:

1. An attachment structure for attaching an object to a subject comprising:
    a plurality of attaching legs projected from an outer surface of the object, disposed on and overlapped with the subject;
    a single washer fixed to the subject together with one attaching leg by a bolt, while being directly disposed on and overlapped with a side of at least one of the attaching legs, the side facing away from the subject; and
    a cover directly attached to the one attaching leg, holding the washer between a substrate portion of the cover and the one attaching leg, and having an exposing hole for exposing a first hole provided on the washer,
    wherein a diameter of the first hole is smaller than a diameter of a second hole provided on the one attaching leg for inserting a shaft of the bolt,
    wherein the washer is held between the one attaching leg and the cover movably in at least a range where the first hole is overlapped with the second hole provided on the one attaching leg, received in a concave portion formed on a surface of the one attaching leg,
    wherein a size from an edge of the first hole to an outer edge of the washer is equal to a size from an edge of the second hole to an outer edge of the concave portion such that in any position within the concave portion the washer is moved without the shaft of the bolt being inserted into the first hole and the second hole, the entire first hole consistently overlaps with the second hole, and
    wherein the washer is a round shape in plan view.

2. The attachment structure as claimed in claim 1, wherein the cover includes: a substrate for holding the washer between the substrate and the one attaching leg; a peripheral plate projected from an edge of the substrate and overlapped with a side wall of the one attaching leg; and a locking portion provided on the peripheral plate to be locked with the one attaching leg, and
    wherein when the cover is slid with respect to the one attaching leg, the locking portion is locked with the one attaching leg.

3. The attachment structure as claimed in claim 2, wherein a projection is projected from an outer surface of the substrate.

* * * * *